US007463740B2

(12) United States Patent
Kushida

(10) Patent No.: US 7,463,740 B2
(45) Date of Patent: Dec. 9, 2008

(54) SOUND DATA PROCESSING APPARATUS FOR SIMULATING ACOUSTIC SPACE

(75) Inventor: Koji Kushida, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 787 days.

(21) Appl. No.: 10/753,156

(22) Filed: Jan. 6, 2004

(65) Prior Publication Data

US 2004/0141623 A1 Jul. 22, 2004

(30) Foreign Application Priority Data

Jan. 7, 2003 (JP) ............................ 2003-001328

(51) Int. Cl.

*H03G 3/00* (2006.01)
*H04R 5/00* (2006.01)
*H04R 5/02* (2006.01)
*G10H 1/02* (2006.01)
*G10H 5/00* (2006.01)

(52) U.S. Cl. ............................ 381/63; 381/61; 381/17; 381/18; 381/19; 381/20; 381/307; 381/309; 381/310; 84/630; 84/707

(58) Field of Classification Search .................. 381/61, 381/119, 63, 17–20, 307, 309–310; 84/63, 84/707

See application file for complete search history.

(56) References Cited

U.S. PATENT DOCUMENTS 6,363,155 B1 3/2002 Horbach
6,751,322 B1 * 6/2004 Carlbom et al. ............... 381/63
6,931,134 B1 * 8/2005 Waller et al. .................. 381/27
7,099,482 B1 * 8/2006 Jot et al. ....................... 381/61

FOREIGN PATENT DOCUMENTS

JP 08-286690 11/1996
JP 09-044176 2/1997
JP 2000-267675 9/2000

* cited by examiner

*Primary Examiner*—Vivian Chin
*Assistant Examiner*—George C Monikang
(74) *Attorney, Agent, or Firm*—Morrison & Foerster LLP

(57) ABSTRACT

A data processing apparatus is designed for simulating an acoustic characteristic of an acoustic space which contains a sound source for generating a sound and a sound receiving point for receiving the sound. In the apparatus, each of a plurality of characteristic control sections processes sound data and outputs the processed sound data. The characteristic control sections correspond to transmission paths which must exist in the acoustic space such that the sound generated from the sound source travels to the sound receiving point through the respective transmission paths. An instruction section provides a processing instruction of the sound data to each characteristic control section such that each characteristic control section processes the sound data according to the provided processing instruction to thereby execute the simulation of the sound traveling through the corresponding transmission path.

5 Claims, 7 Drawing Sheets

SOUND DATA PROCESSING APPARATUS FOR SIMULATING ACOUSTIC SPACE

BACKGROUND OF THE INVENTION

1. Industrial Field of Utilization

The present invention relates generally to a technology for simulating an acoustic space in which a sound source for generating sounds and a sound receiving point for listening to the sounds generated by this sound source are arranged.

2. Prior Art

Technologies have been proposed in which the acoustic characteristics of a particular acoustic space are simulated by the addition of reverberation to inputted sounds, for example. In this type of simulation, a path along which a sound generated by a sound source travels to a sound receiving point must be specified (this path hereinafter referred to as a transmission path). For the determination of this transmission path, a so-called mirror image method is in wide use. The mirror image method assumes an mirror image of a sound source arranged in an acoustic space, relative to one of walls forming this acoustic space and, on the basis of the position of this mirror image, the mirror image method determines a reflective point of the sound and a sound transmission path extending from the sound source to the sound receiving point (refer to patent document 1 below for example).

Patent document 1 is Japanese Published Unexamined Patent Application No. Hei 8-286690 (refer to paragraphs 0004 through 0007 and FIGS. 5 and 6)

However, some of the mirror images assumed by the mirror image method correspond to transmission paths which do not exist in the actual acoustic space. Therefore, it is necessary to determine whether each mirror image assumed in the acoustic space can establish a true transmission path, which results in an increased amount of computation required for carrying out simulations. Especially, in the case where the positional relationship between the sound source and the sound receiving point within an acoustic space changes with time, it becomes necessary, every time the change takes place, to re-determine whether the mirror image establishes the true transmission path, thereby making more conspicuous the problem of the increased amount of simulation computation.

SUMMARY OF THE INVENTION

It is therefore an object of the present invention to provide a data processing apparatus, a data processing method and a computer program which are intended to alleviate the amount of computation for carrying out the simulation of the acoustic characteristics of acoustic spaces.

In carrying out the invention and according to one aspect thereof, there is provided a data processing apparatus for simulating an acoustic characteristic of an acoustic space in which a sound source for generating a sound and a sound receiving point for receiving the sound are arranged. The inventive data processing apparatus comprises a storage section that stores sound data indicative of a sound to be generated from the sound source, a plurality of characteristic control sections each of which processes the sound data stored in the storage section and outputs the processed sound data, the plurality of the characteristic control sections corresponding to a plurality of transmission paths which must exist in the acoustic space such that the sound generated from the sound source travels to the sound receiving point through each of the transmission paths, an instruction section that provides a processing instruction of the sound data to each of the plurality of the characteristic control sections such that each of the plurality of the characteristic control sections processes the sound data according to the provided processing instruction to thereby execute the simulation of the sound traveling through the corresponding transmission path, and an output control section that distributes the sound data supplied from the plurality of the characteristic control sections to one or more output lines.

According to the above-mentioned configuration, because the transmission paths related to the plurality of characteristic control sections on a one to one basis are always exist in the acoustic space, there is no need for determining whether a mirror image of the sound source establishes a true transmission path reaching the sound receiving point. Consequently, the above-mentioned configuration can mitigate the load of processing necessary for the simulation of acoustic characteristics. Especially, if the positional relationship between the sound source and the sound receiving point in the acoustic space changes from time to time, there is no need for newly determining the establishment of the transmission paths associated with each mirror image every time such a change takes place, thereby making more conspicuous the effects of reducing the computational amount.

In carrying out the invention and according to another aspect thereof, there is provided a data processing apparatus for simulating an acoustic characteristic of an acoustic space which is surrounded by walls and which contains a sound source for generating a sound and a sound receiving point for receiving the sound. The inventive data processing apparatus comprises a storage section that stores sound data indicative of a sound to be generated from the sound source, a plurality of characteristic control sections each of which processes the sound data stored in the storage section and outputs the processed sound data, the plurality of the characteristic control sections corresponding to a plurality of transmission paths which must exist in the acoustic space such that the sound generated from the sound source travels to the sound receiving point through each of the transmission paths, the plurality of the characteristic control sections being arranged into two or more groups according to a number of reflections of the sound by the walls occurring in the transmission paths such that each group contains the characteristic control sections corresponding to the transmission paths involving the same number of reflections of the sound, an output control section that is arranged in correspondence with the groups of the characteristic control sections for distributing the sound data supplied from each group of the characteristic control sections to one or more output lines, one or more of reflection characteristic control sections arranged in correspondence to one or more of the groups containing the characteristic control sections corresponding to the transmission paths involving one or more of reflections of the sound, the reflection characteristic control section processing the sound data fed from the characteristic control sections of the corresponding group to apply a reflection characteristic to the sound data and outputting the processed sound data to a next group of the characteristic control sections corresponding to the transmission paths having a smaller number of reflections than the corresponding group, and an instruction section that provides a processing instruction of the sound data to each of the plurality of the characteristic control sections such that each of the plurality of the characteristic control sections processes the sound data according to the provided processing instruction to thereby execute the simulation of the sound traveling through the corresponding transmission path, the instruction section also providing a reflection processing instructions to each of the reflection characteristic control sections such that each of the reflection characteristic control sections processes the sound data according to the provided reflection processing instruction to thereby execute simulation of one reflection of the sound by the wall of the acoustic space.

According to the above-mentioned configuration, because the transmission paths related to the plurality of characteristic control sections on a one to one basis are always exist in the acoustic space, the same effects as those provided by the data processing apparatus of the first aspect can be attained. In addition, according to the above-mentioned configuration, among a plurality of transmission paths, the reflection characteristic control section is shared for each characteristic control section dealing with the same number of reflections, so that the above-mentioned configuration is simpler than a configuration in which reflection characteristic control sections are arranged for transmission paths on a one to one basis. Further, among the transmission paths having two or more reflections, the reflection characteristic control section for introducing one reflection event into sound data is used also as the reflection characteristic control section which introduces into sound data one reflection event on a transmission path having less number of reflections, so that a simpler configuration can be attained than a configuration in which filters are arranged in accordance with the number of reflections for each group.

The data processing apparatus according to the above-mentioned first or second aspect may further comprise a filter section that filters the sound data in order to add an attenuation characteristic corresponding to a distance between the sound source and the sound receiving point to the sound data, and that outputs the filtered sound data to each of the plurality of the characteristic control sections. This configuration can incorporate the acoustic characteristics common to all transmission paths into sound data.

The characteristic control section is responsive to the processing instruction from the instruction section for processing the sound data in order to simulate at least one of a reflection characteristic of a wall bordering the acoustic space by which the sound is reflected, an absorbing characteristic of a fluid filling the acoustic space through which the sound is absorbed, an attenuation characteristic of the transmission path through which the sound travels, and a directivity characteristic of the sound of the sound source from which the sound is emitted.

The data processing apparatus desirably comprises a filter section that filters the sound data in order to simulate a directivity characteristic of the sound source and outputs the filtered sound data, and a delay section that delays the filtered sound data outputted from the filter section and outputs the delayed sound data. In this configuration, the delay section comprises a delay line unit having a plurality of taps which are positioned linearly and which are selected to input and output the sound data such that the delay line unit applies a delay amount to the sound data according to positions of the selected taps.

The data processing apparatus associated with the invention may deal with an acoustic space having a cuboid shape bordered by walls. The instruction section identifies each transmission path corresponding to each of the plurality of the characteristic control sections on the basis of mirror images of the sound source relative to the walls bordering the acoustic space, the instruction section operating when a mirror image exists commonly to two or more walls for identifying one transmission path based on the mirror image in association with one of the two or more walls. Consequently, there is no need for identifying the transmission paths for all mirror images, thereby reducing the amount of computations necessary for the identification of transmission paths.

The present invention may also include a program for operating a computer to function as the above-mentioned data processing apparatus according to the first or second aspect. This program may be installed in the computer from a network or from recording media such as optical disks.

DETAILED DESCRIPTION OF THE INVENTION

This invention will be described in further detail by way of example with reference to the accompanying drawings.

A: The First Embidiment

Figure 1:
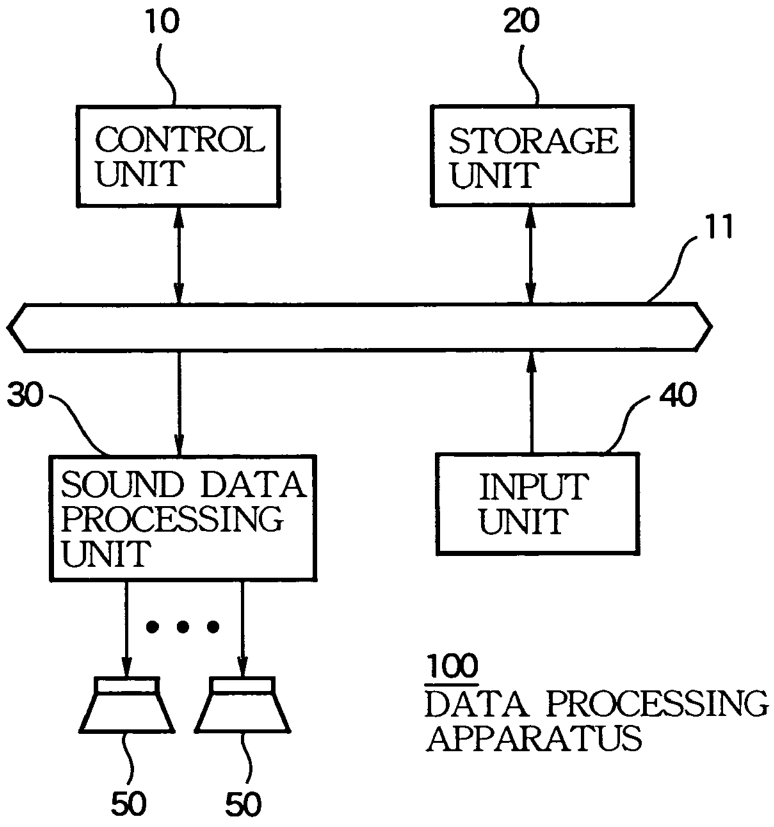
FIG. 1 is a block diagram illustrating a configuration of a data processing apparatus practiced as one embodiment of the invention.

A data processing apparatus practiced as a first embodiment of the present invention is an apparatus for simulating an acoustic space in which a sound source for generating sounds and a sound receiving point for receiving these sounds are arranged. As shown in FIG. 1, a data processing apparatus 100 has a control unit 10, a storage unit 20, a sound data processing unit 30, and an input unit 40. The storage unit 20, the sound data processing unit 30, and the input unit 40 are connected to the control unit 10 via a bus 11.

The control unit 10 is a unit for controlling the data processing apparatus in its entirety. To be more specific, the control unit 10 has a CPU (Central Processing Unit) which executes programs to control the component units of the data processing apparatus and executes various computation processing operations, a ROM (Read Only Memory) which stores the programs to be executed by the CPU, and a RAM (Random Access Memory) which provides a work area for use by the CPU.

The storage unit 20 is means for storing programs to be executed by the control unit 10 and data which are executed when these programs are executed. For example, a hard disk unit or an optical disk unit for example is used for this storage unit 20. The storage unit 20 stores a program for providing various parameters for simulating an acoustic space to the sound data processing unit 30 (this program hereinafter referred to as a simulation program). In addition, the storage unit 20 stores data which represent sounds to be listened to by listeners (these data hereinafter referred to as sound data). Sound data are digital data which are obtained by sampling, by a predetermined period, the waveforms of various sounds such as performance sounds generated by musical instruments and natural sounds. These sound data are read by the control unit 10 to be sequentially outputted to the sound data processing unit 30. It should be noted that, instead of storing the music data in the storage unit 20 or along with this configuration, sound data may be inputted from the outside via an input means connected to the data processing apparatus. For example, while sound data are transmitted from a server unit accommodated on a network such as the Internet, these sound data may be received by a communication unit which is the above-mentioned input means to be processed by the data processing apparatus 100.

The sound data processing unit 30 is means for simulating an acoustic space by processing sound data in a variety of manners such as filtering and is constituted by a DSP (Digital Signal Processor). The contents of the manipulation to be executed on sound data are identified by parameters specified by the control unit 10. As shown in FIG. 1, a plurality of speakers 50 (4 speakers in the present embodiment) are connected to the sound data processing unit 30. Each speaker 50 is a device for outputting sounds on the basis of the sound data obtained after the sound data manipulation by the sound data processing unit 30. It should be noted that the speaker 50 is used for example for a sound outputting device; instead, an earphone or a headphone to be furnished on the ear of user may be arranged.

The present embodiment assumes a space inside a cuboid as an acoustic space to be simulated by the sound data processing unit 30 (this space hereinafter referred to as a "cuboid space"). Namely, the acoustic space to be simulated is enclosed by six rectangular walls opposed to each other in parallel. In addition, the first embodiment simulates, of the sounds generated by a sound source and received by a sound receiving point, a direct sound, a primary reflected sound, and a secondary reflected sound, while ignoring the other reflected sounds (a tertiary reflected sound and so on). It should be noted that the direct sound denotes a sound which directly reaches the sound receiving point, namely the sound which reaches the sound receiving point without being reflected from any walls of the acoustic space. The primary reflected sound denotes a sound which reaches the sound receiving point after being reflected from only one wall of the acoustic space. The secondary reflected sound denotes a sound which reaches the sound receiving point after being reflected two walls of the acoustic space.

In the first embodiment, the control unit 10 computes various characteristic quantities such as a distance traveled by a sound from the sound source to the sound receiving point (this distance hereinafter referred to as "path length") and the arrival direction of sound relative to the sound receiving point (this direction hereinafter referred to as "sound arrival direction") and gives the parameters according to the computed characteristic quantities to the sound data processing unit 30. In order to obtain these characteristic quantities, the control unit 10 is adapted to identify, from time to time, transmission paths along which sounds generated by the sound source reach the sound receiving point in an acoustic space. In the first embodiment, these transmission paths are identified on the basis of the mirror image method. The details thereof are as follows.

Figure 2:
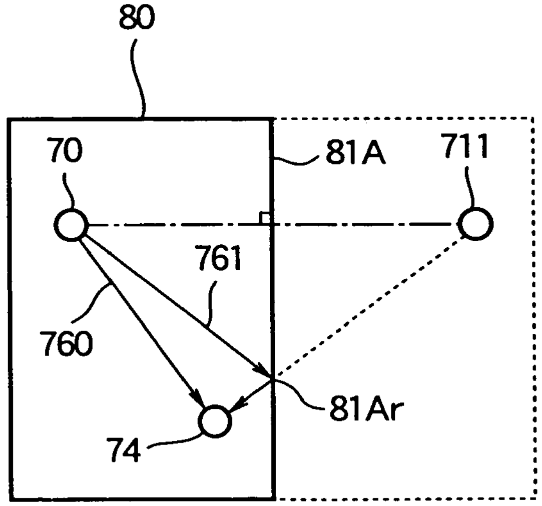
FIG. 2 is a diagram illustrating a method of identifying the transmission paths of direct sound and primary reflected sounds.

First, the transmission path of a primary reflected sound may be identified by supposing a primary mirror image of the sound source relative to each wall of the acoustic space. Namely, as shown in FIG. 2, suppose a primary mirror image 711 of a sound source 70 relative to a wall 81A of an acoustic space 80, then an intersection point 81Ar between the straight line extending from the primary mirror image 711 to a sound receiving point 74 and the wall 81A provides the position at which the sound reflects, so that a broken line extending the sound source 70 to the sound receiving point 74 via the reflection point 81Ar is identified as a transmission path 761 of the primary reflected sound. In the acoustic space which is a cuboid space, this transmission path 761 always exists for each of the six walls, so that a total of six transmission paths 761 exist for each primary reflected sound (namely, regardless of the positional relationship between the sound source 70 and the sound receiving point 74). As seen from FIG. 2, a transmission path 760 of a direct sound always exists as one path which connects the sound source 70 and the sound receiving point 74 with a straight line.

Figure 3:
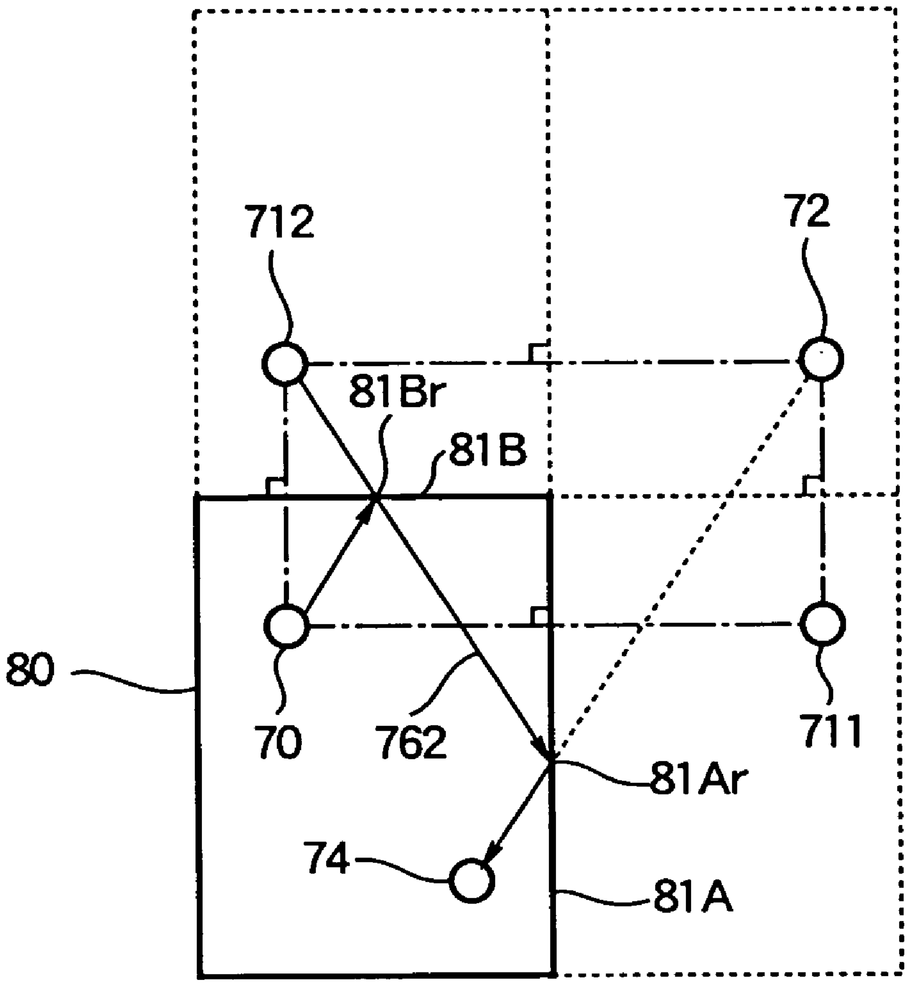
FIG. 3 is a diagram illustrating a method of identifying the transmission paths of secondary reflected sounds.

On the other hand, as shown in FIG. 3, a transmission path 762 of a secondary reflected sound is identified by supposing a primary mirror image and a secondary mirror image of the sound source 70 relative of each wall. Namely, as shown in the same figure, a primary mirror image 712 of the sound source 70 relative to a wall 81B and a mirror image (namely a secondary mirror image) 72 of the primary mirror image 712 relative to a wall 81A are supposed. At this moment, an intersection point 81Ar between the straight line extending from the secondary mirror image 72 to the sound receiving point 74 and an intersection point 81Br between the straight line extending from this intersection point 81Ar to the primary mirror image 712 are identified as positions of reflection. Therefore, the broken line connecting the sound source 70, the reflection point 81Br, the reflection point 81Ar, and sound receiving point 74 is identified as the transmission path 762 of the secondary reflected sound.

Meanwhile, when a secondary mirror image is considered from the primary mirror image 711 of the sound source 70 relative to the wall 81A as shown in FIG. 3, this secondary mirror image completely matches the secondary mirror image 72 supposed relative to the primary mirror image 712. Therefore, only a secondary mirror image supposed from one of the primary mirror images may be considered for the secondary mirror image for identifying the transmission path 762 of a secondary reflected sound. The number of secondary mirror images which can be supposed from the primary mirror images on all walls of the acoustic space 80 is a total of 30. Of these secondary mirror images, the 6 secondary mirror images relative to the opposed walls may be supposed alone without being superimposed on the other secondary mirror images, while the remaining 24 secondary mirror images are superimposed on each other. Therefore, in the acoustic space 80 which is a cuboid space, a total of 18 transmission paths (="12 transmission paths based on one of duplicate secondary mirror images"+"6 transmission paths based on the secondary mirror images not duplicate") always exist for each secondary reflected sound.

Figure 4:
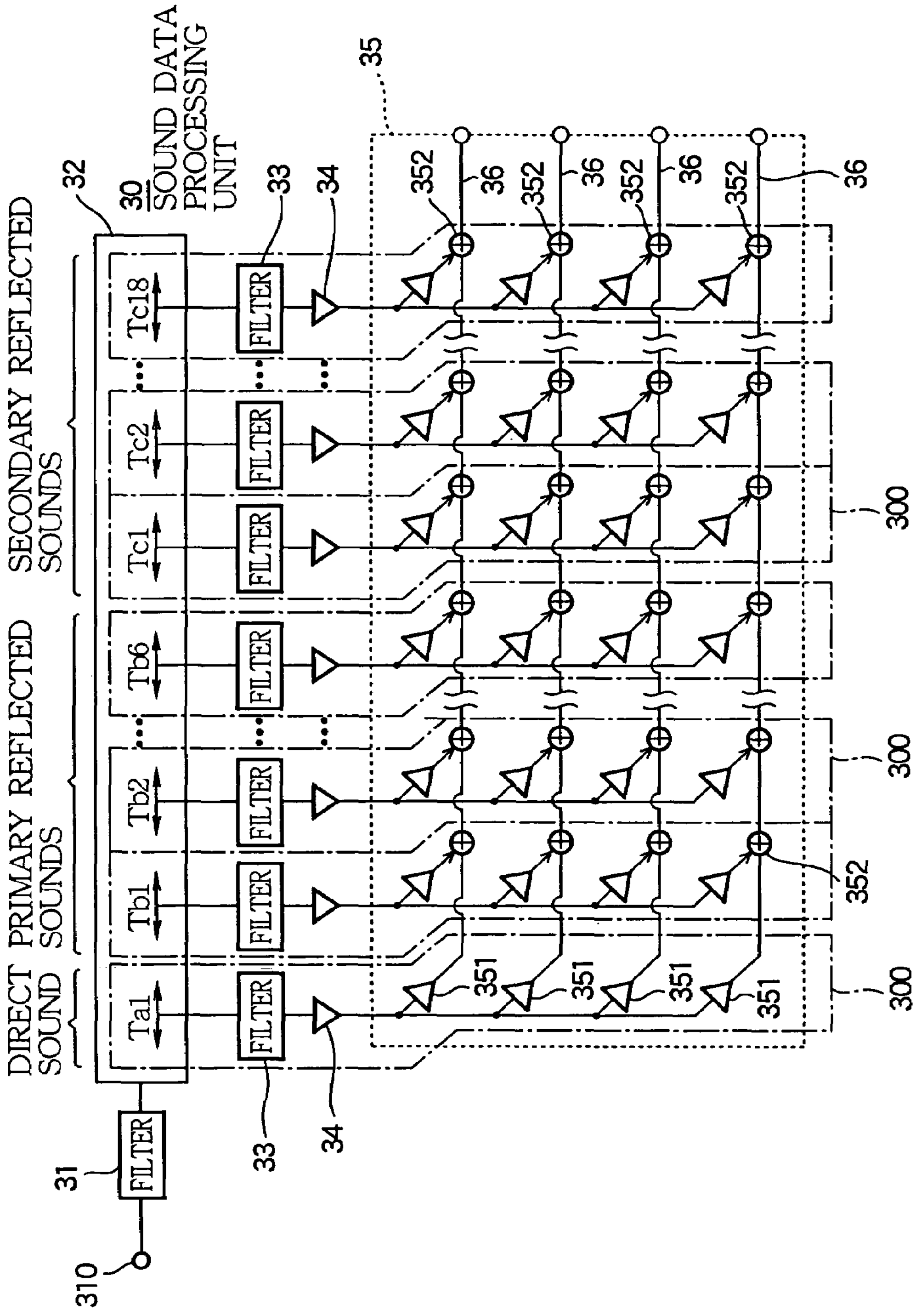
FIG. 4 is a block diagram illustrating a configuration of a sound data processing unit incorporated in the above-mentioned data processing apparatus.

The following describes a specific configuration of the sound data processing unit 30 with reference to FIG. 4. As shown, the sound data processing unit 30 has a common filter 31, a delay line 32, a plurality of filters 33, a plurality of multipliers 34, and a matrix mixer 35. These components provide means for processing sound data in manners specified by the parameters given by the control unit 10.

The common filter 31 provides means for filtering the sound data sequentially inputted from the control unit 10 via one input terminal 310. By this filter processing, the attenuation characteristics in accordance with the distance common to all transmission paths of direct sound, primary reflected sounds, and secondary reflected sounds are simulated. It should be noted that the filter processing by the common filter 31 may be executed by a filter 33 to be described later. In this configuration, the common filter 31 may be omitted.

The delay line 32 is a so-called multi-tap delay, providing means for delaying the sound data outputted from the common filter 31 by different durations of time and outputting the delayed sound data from a plurality of taps T (Ta1, Tb1 through Tb6 and Tc1 through Tc18). Namely the sound data outputted from each tap T are obtained by delaying the sound data inputted from the common filter 31 by the duration of time specified by the control unit 10.

As described above, the total number of transmission paths which always exist in the acoustic space 80 which is a cuboid space is 25 ("1 direct sound"+"6 primary reflected sounds"+"18 secondary reflected sounds"). In the first embodiment, the delay line 32 has a total of 25 taps T each related to one of the 25 transmission paths. To be more specific, tap Ta1 shown in FIG. 1 is related to the transmission path 760 of direct sound, taps Tb1 through Tb6 are related to the transmission paths 761 of primary reflected sounds, and taps Tc1 through Tc18 are related to the transmission paths 762 of secondary reflected sounds.

Following these taps T, the filters 33 and multipliers 34 are arranged. Each filter 33 provides means for filtering the sound data outputted from the tap T of the preceding stage on the basis of parameters given from the control unit 10. Namely, each filter 33 filters the sound data such that a manner in which the frequency characteristics of the sound generated by the sound source 70 change as the sound is absorbed in the air when the sound travels along the transmission path corresponding to the filter 33 is simulated. It should be noted that, in the above-mentioned configuration, the absorption of sound in the air is assumed; instead, the absorption in another fluid (water for example) that fills the acoustic space 80 may be assumed. Further, the filters 33 corresponding to the transmission paths 761 of primary reflected sounds and the transmission paths 762 of secondary reflected sounds (namely, the filters 33 arranged after taps Tb1 through Tb6 and taps Tc1 through Tc18) filter the sound data such that a manner in which the frequency characteristics of primary reflected sounds and secondary reflected sounds change the with reflection on the wall 81 is simulated. On the other hand, each multiplier 34 multiplies the sound data by a specific coefficient such that a manner in which the sound pressure level of the sound generated by the sound source 70 attenuates over the transmission path corresponding to this multiplier 34 until the sound reaches the sound receiving point 74 in accordance with the length of this transmission path is simulated. For example, as the length of the transmission path increases, a comparatively small coefficient is used; as the length of the transmission path decreases, a comparatively large coefficient is used.

The matrix mixer 35 provides means for distributes the sound data outputted from the multiplier 34 to four channels of output lines 36. To be more detail, the matrix mixer 35 has multipliers 351 each arranged at the intersection between the output line of each multiplier 34 and each output line 36 of four channels and supplies the sound data outputted from each multiplier 351 to the output line 36 via an adder 352. Each multiplier 351 provides means for multiplying the sound data by a coefficient given by the control unit 10 and outputting the resultant sound data. Four multipliers 351 corresponding to one transmission path multiply the sound data by a specific coefficient such that the sound pressure level of the sound outputted from each channel is balanced in accordance with the sound arrival direction in that transmission path to the sound receiving point 74. It should be noted that, in the above-mentioned configuration, the multiplier 34 for simulating sound attenuation in distance and the multiplier 351 for simulating sound arrival direction are arranged separately; however, both simulations may be implemented by a single multiplier. In this case, one of the multipliers 351 of the matrix mixer 35 multiplies the sound data by a coefficient which takes both sound attenuation in distance and sound arrival direction into account.

As described above, in the first embodiment, sound data are processed for each of the transmission paths existing in the acoustic space 80. In what follows, a set of elements for processing sound data in order to simulate one transmission path is referred to as "characteristic control channel 300." As obvious from the above-mentioned description, the characteristic control channel 300 in the first embodiment is composed of the delay line 32 for adjusting delay amount, the filter 33 for simulating the characteristic of absorption in the air and the reflection characteristic on the wall, the multiplier 34 for simulating sound attenuation in distance, and the multiplier 351 for simulating sound arrival direction.

The input unit 40 shown in FIG. 1 has a pointing device such as a mouse and a keyboard for entering letters and symbols and outputs signals representing user operations to the control unit 10. Appropriately operating the input unit 40, the user can specify a mode of the acoustic space to be simulated and the positional relationship between the sound source and the sound receiving point in this acoustic space.

Figure 5:
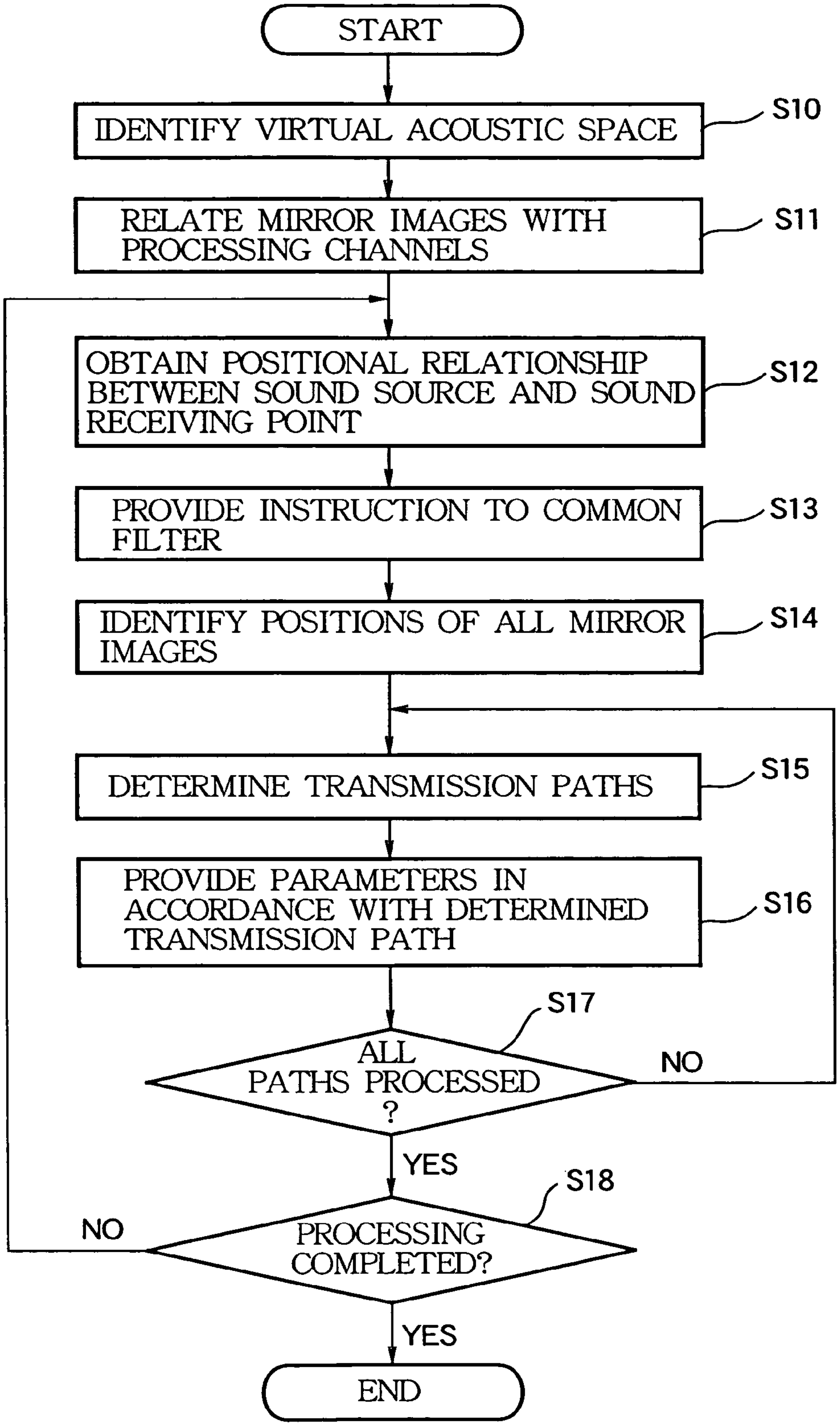
FIG. 5 is a flowchart for describing the operation of a control unit in the above-mentioned data processing apparatus.

The following describes the operation of the first embodiment. First, when the user specifies the start of a simulation through the input unit 40, the input unit 40 loads a simulation program into the RAM and executes the program. FIG. 5 is a flowchart indicative of the flow of the processing by the simulation program.

As shown in FIG. 5, the control unit 10 identifies, as instructed by the user, the mode of the acoustic space 80 to be simulated, namely the size of the acoustic space 80 and the reflection characteristic of each wall 81 (step S10). In the first embodiment, a cuboid space is assumed as the acoustic space 80, so that the length, width, and depth of the acoustic space 80 are identified as the size thereof. On the other hand, the storage unit 20 stores the contents of a plurality of different reflection characteristics, any one of which is selected by the user as the characteristic of each wall 81 of the acoustic space 80. The control unit 10 identifies the reflection characteristic thus selected as the characteristic of each wall 81.

Next, the control unit 10 determines a correlation between each mirror image for identifying the transmission paths of primary reflected sounds and secondary reflected sounds and the characteristic control channel 300 which executes the simulation associated with these transmission paths (step S11). In other words, the 10 determines which of the characteristic control channels 300 is to execute the simulation of the transmission paths identified by each mirror image. As described above, the number of primary mirror images corresponding to the transmission paths 761 of primary reflection sounds is 6 which is equivalent to the number of walls 81 and the number of secondary mirror images corresponding to the transmission paths 762 of secondary reflected sounds is 18 if duplication is taken into account. Therefore, the control unit 10 determines the correlation between the six primary mirror images for identifying the transmission paths 761 of primary reflected sounds and the six characteristic control channels 300 in the sound data processing unit 30 and the correlation between the 18 mirror images for identifying the transmission paths of secondary reflected sounds and the 18 characteristic control channels 300 in the sound data processing unit 30. It should be noted that these correlations may be determined beforehand and stored in the storage unit 20. In this case, step S11 shown in FIG. 5 may be omitted.

Then, when an instruction for starting simulation is given by the user, the control unit 10 sequentially supplies the sound data from the storage unit 20 to the sound data processing unit 30. On the other hand, appropriately operating the input unit 40, the user enters the coordinates of the sound source 70 and the coordinates of the sound receiving point 74 in the acoustic space 80. Receiving these coordinates, the control unit 10 identifies the positional relationship between the sound source 70 and the sound receiving point 74 (step S12). Next, the control unit 10 supplies the parameters in accordance with the positional relationship between the sound source 70 and the sound receiving point 74 (especially, the distance between them) to the common filter 31 (step S13).

Next, on the basis of the coordinates of the sound source 70 determined in step S12, the control unit 10 identifies the positions of all mirror images that can be assumed with respect to primary reflected sounds and secondary reflected sounds by considering the duplication of the secondary reflected sounds (step S14). Then, on the basis of the position of one of the mirror images and the positions of the sound source 70 and the sound receiving point 74, the control unit 10 identifies the mode of any one of the transmission paths of direct sound, primary reflected sounds, and secondary reflected sounds (step S15). The method of identifying the mirror image position in step S14 and the method of identifying the transmission path in step S15 are as described above with reference to FIGS. 2 and 3.

Next, on the basis of the mode of the transmission path identified in step S15 (hereafter referred to as "target transmission path"), the control unit 10 computes the parameters to give to the characteristic control channel 300 for simulating the target transmission path and supplies the obtained parameters to each component blocks of the characteristic control channel 300 (step S16). For example, of the characteristic control channel 300 related to the target transmission path, the control unit 10 supplies a delay amount in accordance with the length of the target transmission path to the tap T of the delay line 32, a filter coefficient in accordance with the characteristic of the wall 81 on which the target transmission path runs to the filter 33, a coefficient in accordance with the length of the target transmission path to the multiplier 34, and coefficients in accordance with the sound arrival directions relative to the sound receiving point 74 to the four multipliers 351. As a result, each element of the characteristic control channels 300 corresponding to the target transmission path processes the sound data for simulating the target transmission path.

Subsequently, the control unit 10 determines whether the processing of steps S15 and S16 has been executed on all transmission paths (a total of 25 paths) corresponding to direct sound, primary reflected sounds, and secondary reflected sounds (step S17). If there is found any transmission path that has not been processed in the above-mentioned manner, the control unit 10 executes the processing of steps S15 and S16 on that unprocessed transmission path. If all of the transmission paths are found processed, the control unit 10 goes to step S18. In step S18, the control unit 10 determines whether the simulation is to be ended. To be more specific, if an instruction to end the simulation is given by the user and the processing of all sound data has been completed, the control unit 10 determines that the processing for simulation is to be ended, thereby ending the processing shown in FIG. 5. If the control unit 10 determines that the processing is to be continued, then the control unit 10 goes to step S12 to repeat the above-mentioned processing therefrom. If the positional relationship between the sound source 70 and the sound receiving point 74 has consequently been changed by the user (step S12), then the simulation taking this change into consideration will be executed.

As described above, in the first embodiment, the transmission paths which always exists in the acoustic space 80 regardless of the positions of the sound source 70 and the sound receiving point 74 relative to the acoustic space 80 and the positional relationship between the sound source 70 and the sound receiving point 74 is related to the characteristic control channel 300 in a fixed manner. Therefore, whether or not the mirror image of the sound source 70 can establish the transmission path extending from the sound source 70 to the sound receiving point 74 need not be determined, thereby mitigating the load of the processing necessary for simulating the acoustic space 80. And it is established in the first embodiment that the transmission path corresponding to each mirror image always exists in each acoustic space, so that there is no need for newly determining whether a transmission path can be established or not even if the positional relationship between the sound source 70 and the sound receiving point 74 has changed. Consequently, the advantage of mitigating the computational amount provided by the first embodiment is especially conspicuous when the positional relationship between the sound source 70 and the sound receiving point 74 changes from time to time.

B: The Second Embodiment

The following describes a data processing apparatus practiced as a second embodiment of the invention. In the above-mentioned first embodiment, a configuration was shown in which the filter 33 for simulating the reflection characteristics on the wall 81 is arranged for each transmission path. However, given that all the walls 81 of the acoustic space 80 be uniform in reflection characteristic, then the filters taking these reflection characteristics into account may be made common to all the transmission paths. Therefore, the second embodiment is based on a common-filter configuration. It should be noted that, with the data processing apparatus associated with the second embodiment, components similar to those previously described with reference to FIGS. 1 and 2 are denoted by the same reference numerals and the description of these components will be skipped.

Figure 6:
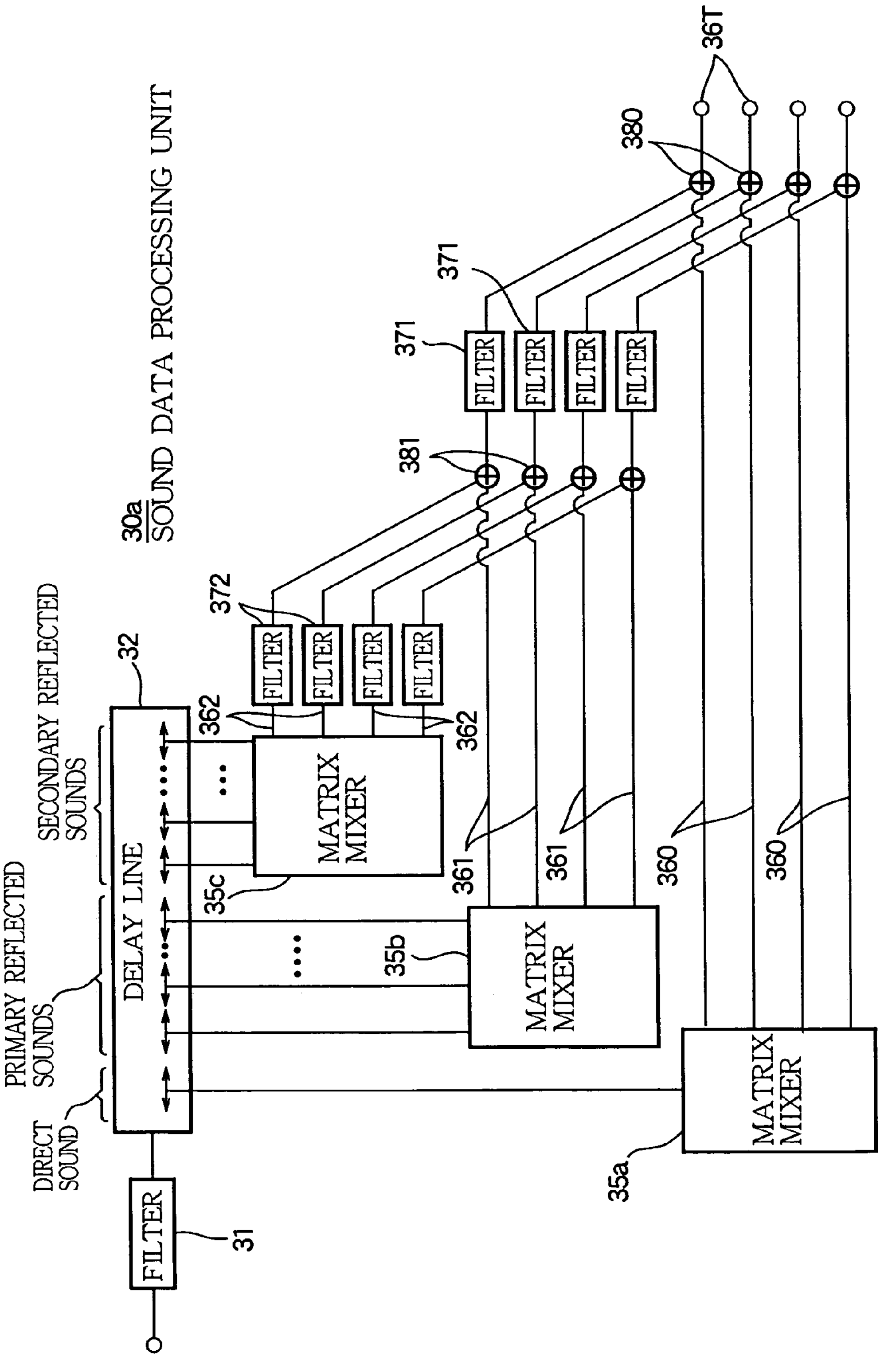
FIG. 6 is a block diagram illustrating a configuration of a sound data processing unit in a data processing apparatus practiced as a second embodiment of the invention.

FIG. 6 is a block diagram illustrating a configuration of a sound data processing unit 30*a* in a data processing apparatus 100 associated with the second embodiment. As shown, in the second embodiment, a matrix mixer is arranged for each group of taps T of a delay line 32 which correspond to a transmission path having the same number of reflections. Namely, after one tap T corresponding to a direct sound (the number of reflections is 0), a matrix mixer 35*a* is arranged; after six taps T corresponding to primary reflected sounds, a matrix mixer 35*b* is arranged; and, after 18 taps T corresponding to secondary reflected sounds, a matrix mixer 35*c* is arranged. Like the matrix mixer 35 shown with reference to the first embodiment, these matrix mixers 35*a*, 35*b*, and 35*c* are each provide means for distributing the sound data supplied from one or more taps T to four output lines. For example, the matrix mixer 35*b* branches the sound data supplied from the taps T corresponding to primary reflected sounds into four lines and multiplies each of the branched sound data by a predetermined coefficient, thereby supplying the resultant four branches of sound data to four output lines 361. It should be note that multipliers (not shown) of the matrix mixers 35*a*, 35*b*, and 35*c* have each both capabilities of reflecting sound attenuation in distance as with the multiplier 34 of the first embodiment in addition to the capabilities of adjusting the balance of output levels. Therefore, the characteristic control channel corresponding to one transmission path in the second embodiment is composed of the delay line 32 for adjusting delay amount and a multiplier for reflecting both sound attenuation in distance and sound arrival direction.

Four output lines 362 extending from the matrix mixer 35*c* corresponding to secondary reflected sounds each have a filter 372. Under the control of a control unit 10, each filter 372 executes filter processing to simulate the reflection characteristic in accordance with one reflection on a wall 81 of an acoustic space 80. On the other hand, four output lines 361 extending from the matrix mixer 35*b* corresponding to primary reflected sounds have each a filter 371 which functions in the same manner as the filter 372. The output terminals of the four filters 372 corresponding to secondary reflected sounds are connected, via adders 381, to the four output lines 361 corresponding to primary reflected sounds. Likewise, the output terminals of the four filters 371 corresponding to primary reflected sounds are connected, via adders 380, to the four output lines 360 extending from the matrix mixer 35*a*.

In this configuration, the sound data outputted from the matrix mixer 35*c* and filtered by the filter 372 and the filter 371, the sound data outputted from the matrix mixer 35*b* and filtered by the filter 371, and the sound data outputted from the matrix mixer 35*a* are added together for each channel, the resultant sound data being supplied to the output terminals 36T of the output lines 360. Namely, the effect of two reflections on the wall 81 is incorporated in the sound data outputted from the taps T corresponding to secondary reflected sounds and the effect of one reflection on the wall 81 is incorporated in the sound data outputted from the taps T corresponding to primary reflected sounds.

The operation of the second embodiment is substantially the same as the operation of the first embodiment described with reference to FIG. 5. A difference lies in that, in step S16 shown in FIG. 5, the control unit 10 gives the parameters to the delay line 32, the multipliers of the matrix mixers 35*a* through 35*c*, the filter 371, and the filter 372.

As described above, also in the second embodiment, the transmission path which always exists in each acoustic space is related to the characteristic control channel 300 in a fixed manner, so that the same effects as those of the first embodiment may be achieved. In addition, in the second embodiment, the filters for considering the reflection characteristic are made common to both primary reflected sounds and secondary reflected sounds, so that, as compared with the first embodiment, a simplified configuration of the sound data processing unit 30 and simplified parameter providing processing may be achieved. Further, in the second embodiment, the filter for simulating one of two reflections in secondary reflected sounds and the filter for simulating one reflection in primary reflected sounds are integrated in one filter. Consequently, as compared with the configuration in which a pair of filters corresponding to the number of reflections for secondary reflected sounds is used, a simplified configuration of the sound data processing unit 30 may be achieved.

<C: Modifications>

While the preferred embodiments of the present invention have been described using specific terms, such description is for illustrative purposes only, and it is to be understood that changes and variations may be made without departing from the spirit or scope of the appended claims. For example, the following variations are possible. It should be noted that, with reference to the drawings shown below, components similar to those previously described in the above-mentioned first and second embodiments are denoted by the same reference numerals and the description of those components will be skipped.

<C-1: Variation 1>

Figure 7:
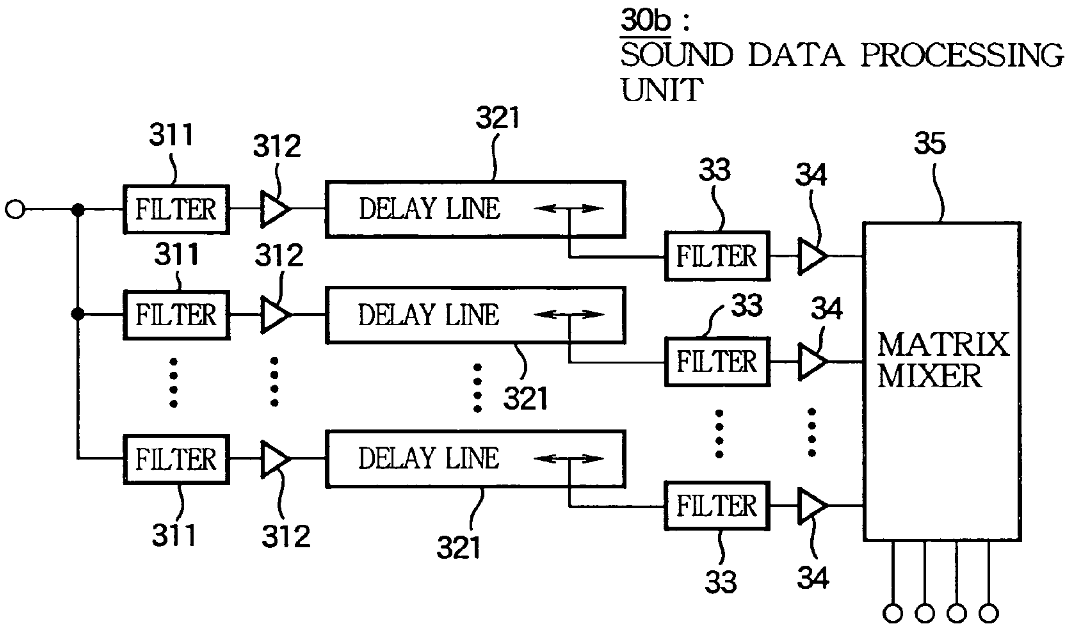
FIG. 7 is a block diagram illustrating a configuration of a data processing unit practiced as a variation of the first embodiment.

In each of the above-mentioned embodiments, a configuration is used in which the delay line 32 common to both primary reflected sounds and secondary reflected sounds is used. Alternatively, separate delay lines may be used for the transmission paths. FIG. 7 is a block diagram illustrating a configuration in which a plurality of delay lines are arranged for the sound data processing unit 30 associated with the above-mentioned first embodiment.

As shown, a sound data processing unit 30*b* associated with variation 1 has a total of 25 delay lines 321 instead of the delay line 32 in the above-mentioned first embodiment. In addition, before each delay line 321, a filter 311 and a multiplier 312 are arranged. The filter 311 and the multiplier 312 provide means for simulating, under the control of a control unit 10, the directivity of a sound source 70 for the sound traveling the transmission path corresponding to the filter 311 and the multiplier 312. To be more specific, the filter 311 simulates a manner in which the frequency characteristic of the sound traveling from the sound source 70 to a sound receiving point 74 changes with directivity. On the other hand, the multiplier 312 adjusts the sound pressure level of the sound traveling from the sound source 70 to the sound receiving point 74 in accordance with the directivity of the sound source 70. Each delay line 321 has one tap T for varying delay amount, the tap B being connected to a filter 33. Therefore, in the configuration shown in FIG. 7, a characteristic control channel corresponding to one transmission path is composed of the filter 311, the multiplier 312, the delay line 321, the filter 33, and a multiplier 34.

The operation of variation 1 is substantially the same as that of the above-mentioned first embodiment described with reference to FIG. 5. However, in step S16 shown in FIG. 5, the control unit 10 gives parameters each filter 311 and each multiplier 312 as well. According to this configuration, an effect of realizing a simulation with higher fidelity may be attained by incorporating the directivity of the sound source 70 into each transmission path which exists in each acoustic space, in addition to the effects attained by the above-mentioned first embodiment. Especially, because the sound data are supplied to the delay line after incorporating the directivity of the sound source 70 into the sound data at the time of releasing a sound (when a sound is released from the sound source), the directivity characteristic of the sound source 70 at the time of sound releasing may be simulated with fidelity. For example, each delay line 321 holds the sounds data incorporated with the directivity characteristic of the sound source 70 at the time of T1, so that, even if the direction of the sound source 70 changes at the time of T2, the sound to be outputted from a speaker 50 is incorporated with the directivity characteristic of the sound source 70 at the time the sound was released from the sound source 70.

Figure 8:
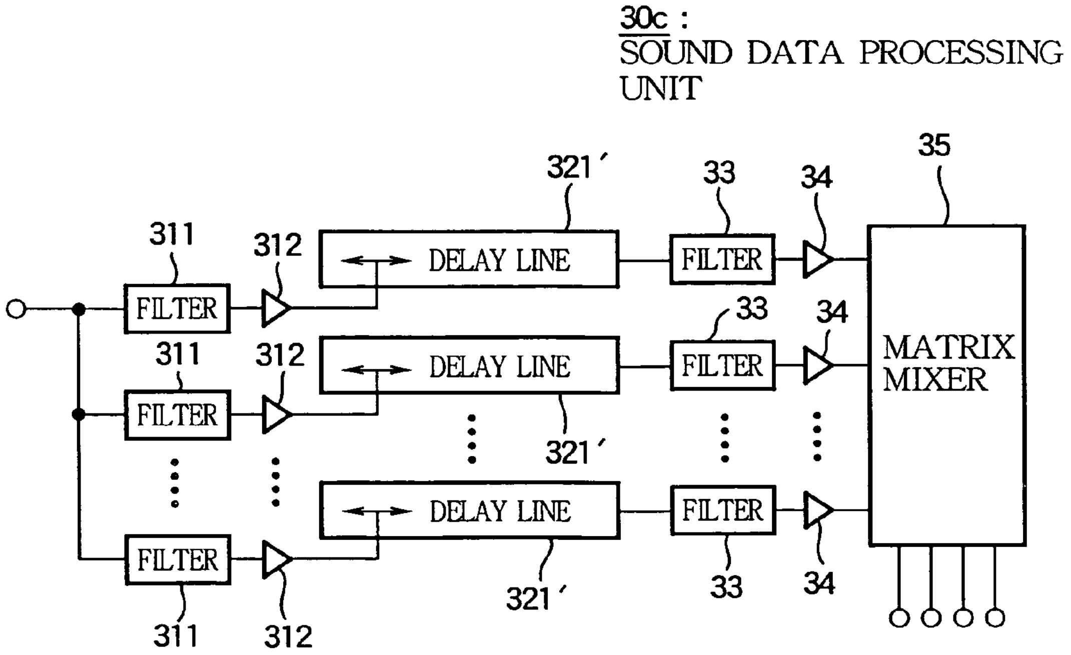
FIG. 8 is a block diagram illustrating a configuration of a data processing unit practiced as another variation of the first embodiment.

In the above-mentioned variation 1, only the delay amount from the point of time at which sound data are inputted in the delay line 321 is controlled. Alternatively, in a configuration in which a delay line is arranged for each transmission path, the position of inputting sound data into each delay line may be adjusted as shown in FIG. 8. To be more specific, in a sound data processing unit 30*c* shown in FIG. 8, the output position (the tap position) in each delay line 321' is constant relative to each transmission path, while the sound data outputted from the multiplier 312 are inputted in the delay line 321' at a position specified by the control unit 10. This configuration allows to delay the sound data in accordance with the position of the sound source 70 at the time of sound releasing before supplying the sound data to the delay line 321', thereby achieving the simulation of the movement of the sound source 70 with fidelity.

Figure 9:
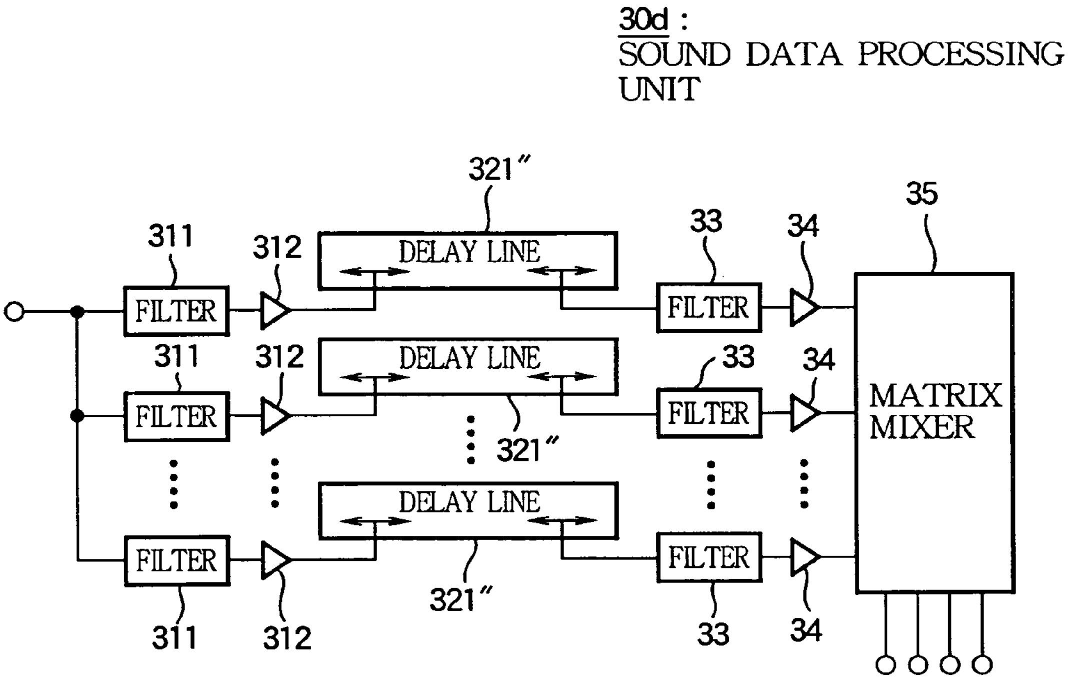
FIG. 9 is a block diagram illustrating a configuration of a data processing unit practiced as still another variation of the first embodiment.

Moreover, the configuration shown in FIG. 7 and the configuration shown in FIG. 8 may be integrated into a configuration shown in FIG. 9. Namely, in a sound data processing unit 30*d*, both the position of inputting sound data into each delay line 321" and the position of outputting sound data from each delay line 321" are controlled by the control unit 10. To be more specific, the position of inputting sound data into each delay line 321" is controlled in accordance with the position of the sound source 70 and, at the same time, the position of outputting sound data from each delay line 321" is controlled in accordance with the position of the sound receiving point 74. This configuration allows both the simulation of the movement of the sound source 70 and the movement of the sound receiving point 74 with fidelity.

It should be noted that FIGS. 7 through 9 show some variations of the configuration of the first embodiment; these variations may also be applied to the configuration shown in the above-mentioned second embodiment. In the configurations shown in FIGS. 7 through 9, the directivity characteristic of the sound source 70 is simulated by the filters 311 and the multipliers 312; alternatively, these elements may be omitted.

<C-2: variation 2>

In the above-mentioned embodiments, the number of output lines 36 is 4; alternatively, this number may be one, two, three, or five or more. In the above-mentioned embodiments, a configuration is used in which direct sound, primary reflected sounds, and secondary reflected sounds are simulated; alternatively, tertiary or higher reflected sounds may be simulated by the same configuration or any of direct sound, primary reflected sounds, and secondary reflected sounds may be excluded from the simulation. In the above-mentioned embodiments, only one sound source 70 and only one sound receiving point 74 are arranged; alternatively, two or more sound sources 70 and two or more sound receiving points 74 may be arranged. In this case, the transmission path extending from each sound source 70 to each sound receiving point 74 is identified for each sound source 70 and each of the identified transmission path is related to each characteristic control channel 300.

<C-3: variation 3>

In the above-mentioned embodiments, the sound data processing unit 30 is constituted by a DSP (Digital Signal. Processor); alternatively, the sound data processing unit 30 may be implemented by the cooperation between the hardware such as a CPU and the software which is executed by the CPU.

In the above-mentioned embodiments, a configuration is used in which the mode of the acoustic space 80 and the positional relationship between the sound source 70 and the sound receiving point 74 are specified by the user; alternatively, these mode and positional relationship may be determined on the data stored in the storage unit 20. For example, the data indicative of the mode of the acoustic space 80 and the positional relationship between the sound source 70 and the sound receiving point 74 (these data hereinafter referred to as "acoustic space data") may be included in the sound data beforehand. Then, the identification of the mode of acoustic space in step S10 shown in FIG. 5 and the identification of the positional relationship in step S12 may be executed on the basis of the stored acoustic space data. Further, in a configuration in which images are shown on a display unit as sounds are outputted (for example, a configuration in which movies are played), the acoustic space data may have the contents which correspond to the images to be displayed. Such a configuration may give movie audience the sense of presence.

As described and according to the invention, the amount of computations necessary for simulating the acoustic characteristics of an acoustic space may be significantly reduced.

What is claimed is:

1. A data processing apparatus for simulating an acoustic characteristic of an acoustic space which is surrounded by walls and which contains a sound source for generating a sound and a sound receiving point for receiving the sound, the apparatus comprising:

a storage section that stores sound data indicative of a sound to be generated from the sound source;

an identifying section that identifies a plurality of transmission paths of a direct sound, a primary reflection sound and a secondary reflection sound, based on positions of the sound source and the sound receiving point in the acoustic space, the direct sound directly traveling from the sound source to the sound receiving point through the identified transmission paths, the primary reflection sound traveling from the sound source to the sound receiving point through the identified transmission paths while reflecting by the wall once, the secondary reflection sound traveling from the sound source to the sound receiving point through the identified transmission paths while reflecting by the walls twice;

a delay line that inputs the sound data stored in the storage section, that delays the sound data by a delay amount corresponding to a distance of each of the transmission paths identified by the identifying section, and that outputs the delayed sound data for each of the transmission paths;

a secondary reflection characteristic matrix mixer that selectively receives, from the delay line, the sound data which are delayed by delay amounts corresponding to distances of the transmission paths of the secondary reflection sound, that multiplies the received sound data by coefficients simulating attenuation corresponding to the distances of the transmission paths of the secondary reflection sound, and that distributes the sound data multiplied by the coefficients to a plurality of channels corresponding to a plurality of speakers;

a secondary reflection characteristic filter that receives the sound data of the respective channels from the secondary reflection characteristic matrix mixer, that applies a common filtering process simulating a reflection characteristic corresponding to one reflection by the wall of the acoustic space to the sound data of the respective channels, and that outputs the sound data applied with the common filtering process to the respective channels;

a primary reflection characteristic matrix mixer that selectively receives, from the delay line, the sound data which are delayed by delay amounts corresponding to distances of the transmission paths of the primary reflection sound, that multiplies the received sound data by coefficients simulating attenuation corresponding to the distances of the transmission paths of the primary reflection sound, and that distributes the sound data multiplied by the coefficients to the respective channels;

a primary reflection characteristic filter that adds the sound data of the respective channels outputted from the primary reflection characteristic matrix mixer and the sound data of the respective channels outputted from the secondary reflection characteristic filter with each other, that applies a common filtering process simulating a reflection characteristic corresponding to one reflection by the wall of the acoustic space to the added sound data of the respective channels, and that outputs the sound data applied with the common filtering process to the respective channels;

a direct sound matrix mixer that selectively receives, from the delay line, the sound data which are delayed by delay amounts corresponding to distances of the transmission paths of the direct sound, that multiplies the received sound data by coefficients simulating attenuation corresponding to the distances of the transmission paths of the direct sound, and that distributes the sound data multiplied by the coefficients to the respective channels; and an output section that adds the sound data of the respective channels outputted from the direct sound matrix mixer and the sound data of the respective channels outputted from the primary reflection characteristic filter with each other, and that outputs the added sound data to the respective channels.

2. The data processing apparatus according to claim 1, wherein each of the secondary reflection characteristic matrix mixer, the primary reflection characteristic matrix mixer, the primary reflection characteristic matrix mixer and the direct sound matrix mixer process the sound data in order to simulate at least one of an absorbing characteristic of a fluid filling the acoustic space through which the sound is absorbed, and a directivity characteristic of the sound of the sound source from which the sound is emitted.

3. The data processing apparatus according to claim 1, wherein the acoustic space has a cuboid shape bordered by walls, and wherein the identifying section identifies each transmission path on the basis of mirror images of the sound source relative to the walls bordering the acoustic space, the identifying section operating when a mirror image exists commonly to two or more walls for identifying one transmission path based on the mirror image in association with one of the two or more walls.

4. A data processing method of simulating an acoustic characteristic of an acoustic space which is surrounded by walls and which contains a sound source for generating a sound and a sound receiving point for receiving the sound, the method comprising:

a first step of identifying a plurality of transmission paths of a direct sound, a primary reflection sound and a secondary reflection sound, based on positions of the sound source and the sound receiving point in the acoustic space, the direct sound directly traveling from the sound source to the sound receiving point through the identified transmission paths, the primary reflection sound traveling from the sound source to the sound receiving point through the identified transmission paths while reflecting by the wall once, the secondary reflection sound traveling from the sound source to the sound receiving point through the identified transmission paths while reflecting by the walls twice;

a second step of inputting sound data indicative of a sound to be generated from the sound source, delaying the sound data by a delay amount corresponding to a distance of each of the transmission paths identified by the first step, and outputting the delayed sound data for each of the transmission paths;

a third step of selectively receiving the sound data which are outputted by the second step and which are delayed by delay amounts corresponding to distances of the transmission paths of the secondary reflection sound, multiplying the received sound data by coefficients simulating attenuation corresponding to the distances of the transmission paths of the secondary reflection sound, and distributing the sound data multiplied by the coefficients to a plurality of channels corresponding to a plurality of speakers;

a fourth step of receiving the sound data of the respective channels outputted by the third step, applying a common filtering process simulating a reflection characteristic corresponding to one reflection by the wall of the acoustic space to the sound data of the respective channels, and outputting the sound data applied with the common filtering process to the respective channels;

a fifth step of selectively receiving the sound data which are outputted by the second step and which are delayed by delay amounts corresponding to distances of the transmission paths of the primary reflection sound, multiplying the received sound data by coefficients simulating attenuation corresponding to the distances of the transmission paths of the primary reflection sound, and distributing the sound data multiplied by the coefficients to the respective channels;

a sixth step of adding the sound data of the respective channels outputted by the fifth step and the sound data of the respective channels outputted by the fourth step with each other, applying a common filtering process simulating a reflection characteristic corresponding to one reflection by the wall of the acoustic space to the added sound data of the respective channels, and outputting the sound data applied with the common filtering process to the respective channels;

a seventh step of selectively receiving the sound data which are outputted by the second step and which are delayed by delay amounts corresponding to distances of the transmission paths of the direct sound, multiplying the received sound data by coefficients simulating attenuation corresponding to the distances of the transmission paths of the direct sound, and distributing the sound data multiplied by the coefficients to the respective channels; and an eighth step of adding the sound data of the respective channels outputted by the seventh step and the sound data of the respective channels outputted by the sixth step with each other, and outputting the added sound data to the respective channels.

5. A machine-readable medium for use in a computer, said medium containing a computer program for performing a method of simulating an acoustic characteristic of an acoustic space which is surrounded by walls and which contains a sound source for generating a sound and a sound receiving point for receiving the sound, computer program being executable by the computer and enabling the computer to operate as a data processing apparatus comprising:

a storage section that stores sound data indicative of a sound to be generated from the sound source;

an identifying section that identifies a plurality of transmission paths of a direct sound, a primary reflection sound and a secondary reflection sound, based on positions of the sound source and the sound receiving point in the acoustic space, the direct sound directly traveling from the sound source to the sound receiving point though the identified transmission paths, the primary reflection sound traveling from the sound source to the sound receiving point though the identified transmission paths while reflecting by the wall once, the secondary reflection sound traveling from the sound source to the sound receiving point though the identified transmission paths while reflecting by the walls twice;

a delay line that inputs the sound data stored in the storage section, that delays the sound data by a delay amount corresponding to a distance of each of the transmission paths identified by the identifying section, and that outputs the delayed sound data for each of the transmission paths;

a secondary reflection characteristic matrix mixer that selectively receives, from the delay line, the sound data which are delayed by delay amounts corresponding to distances of the transmission paths of the secondary reflection sound, that multiplies the received sound data by coefficients simulating attenuation corresponding to the distances of the transmission paths of the secondary reflection sound, and that distributes the sound data multiplied by the coefficients to a plurality of channels corresponding to a plurality of speakers;

a secondary reflection characteristic filter that receives the sound data of the respective channels from the secondary reflection characteristic matrix mixer, that applies a common filtering process simulating a reflection characteristic corresponding to one reflection by the wall of the acoustic space to the sound data of the respective channels, and that outputs the sound data applied with the common filtering process to the respective channels;

a primary reflection characteristic matrix mixer that selectively receives, from the delay line, the sound data which are delayed by delay amounts corresponding to distances of the transmission paths of the primary reflection sound, that multiplies the received sound data by coefficients simulating attenuation corresponding to the distances of the transmission paths of the primary reflection sound, and that distributes the sound data multiplied by the coefficients to the respective channels;

a primary reflection characteristic filter that adds the sound data of the respective channels outputted from the primary reflection characteristic matrix mixer and the sound data of the respective channels outputted from the secondary reflection characteristic filter with each other, that applies a common filtering process simulating a reflection characteristic corresponding to one reflection by the wall of the acoustic space to the added sound data of the respective channels, and that outputs the sound data applied with the common filtering process to the respective channels;

a direct sound matrix mixer that selectively receives, from the delay line, the sound data which are delayed by delay amounts corresponding to distances of the transmission paths of the direct sound, that multiplies the received sound data by coefficients simulating attenuation corresponding to the distances of the transmission paths of the direct sound, and that distributes the sound data multiplied by the coefficients to the respective channels; and an output section that adds the sound data of the respective channels outputted from the direct sound matrix mixer and the sound data of the respective channels outputted from the primary reflection characteristic filter with each other, and that outputs the added sound data to the respective channels.

* * * * *